United States Patent [19]

Fleischmann

[11] Patent Number: 4,774,482

[45] Date of Patent: Sep. 27, 1988

[54] TRANSDUCER FOR A FILTER ARRANGEMENT WITH ACOUSTIC WAVES

[75] Inventor: Bernd Fleischmann, Munich, Fed. Rep. of Germany

[73] Assignee: Siemens Aktiengesellschaft, Berlin & Munich, Fed. Rep. of Germany

[21] Appl. No.: 86,826

[22] Filed: Aug. 19, 1987

[30] Foreign Application Priority Data

Aug. 29, 1986 [DE] Fed. Rep. of Germany ....... 3629418

[51] Int. Cl.⁴ .................. H03H 9/145; H03H 9/25; H03H 9/64
[52] U.S. Cl. ................ 333/193; 310/313 B; 333/194; 333/196
[58] Field of Search .................... 333/150-155, 333/193, 194, 195, 196; 310/313 R, 313 A, 313 B, 313 C, 313 D

[56] References Cited

U.S. PATENT DOCUMENTS

| | | | |
|---|---|---|---|
| 3,792,381 | 2/1974 | Bristol | 333/193 |
| 3,801,937 | 4/1974 | Bristol | 333/196 |
| 4,144,507 | 3/1979 | Shreve | 333/195 X |
| 4,616,197 | 10/1986 | Wright | 333/194 |

OTHER PUBLICATIONS

Surface Wave Filters, Design, Construction, and Use, John Wiley & Sons, A Wiley-Interscience Publication, D. T. Bell, Jr. and Claiborne Phase Code Generators and Correlators, pp. 307-346.

IEEE Transactions on Circuit Theory, vol. CT-20, No. 5, Sep. 1973-Acoustic Surface-Wave Transversal Filters, George L. Matthaei, pp. 459-470.

*Primary Examiner*—Marvin L. Nussbaum
*Attorney, Agent, or Firm*—Hill, Van Santen, Steadman & Simpson

[57] ABSTRACT

A transducer for a filter arrangement with acoustic waves which includes a transducer 1 and 2 comprising groups (3, 4, 6 and 7) of alternating interdigitally spaced electrode fingers (10) in which the neighboring groups (3, 4 or, respectively, 4, 3 or, respectively, 6, 7) are arranged so that they are 80 degrees out of phase relative to each other at the fundamental frequency of the groups.

11 Claims, 1 Drawing Sheet

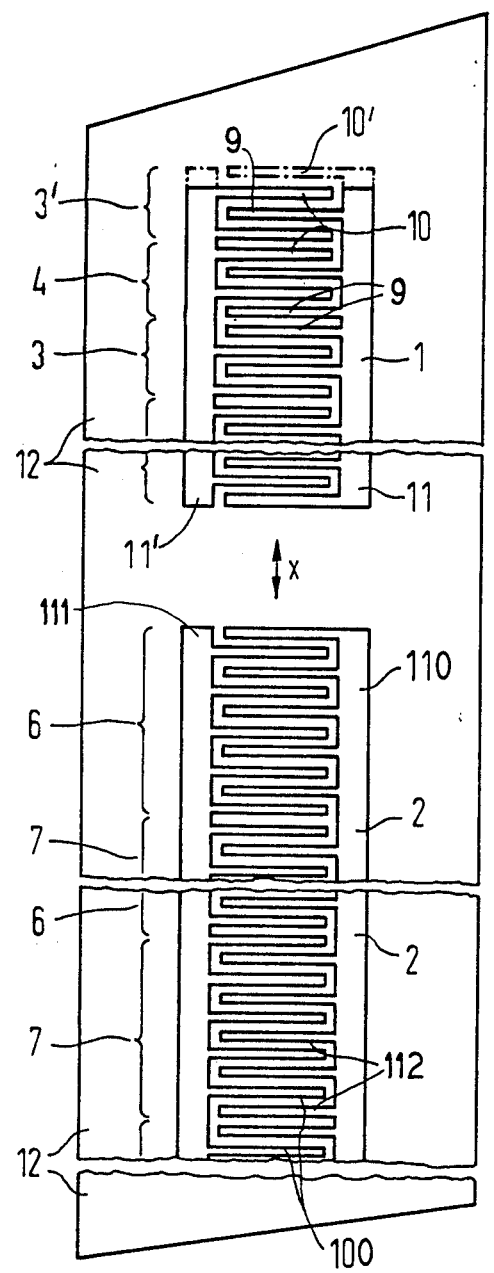

TRANSDUCER FOR A FILTER ARRANGEMENT WITH ACOUSTIC WAVES

BACKGROUND OF THE INVENTION

1. Field of the Invention

This invention relates in general to a transducer which operates with acoustic surface-proximate waves and comprises interdigitally arranged finger electrodes and bus bars mounted on piezoelectric material wherein the finger electrodes are essentially of the same width and have identical spacings from each other wherein the finger electrodes are arranged in groups relative to each other such that the neighboring groups are effective to cause an out-of-phase relationship of the surface waves.

2. Description of the Prior Art

Arrangements which operate with acoustic surface-proximate waves are known. Acoustic surface-proximate waves are waves which are referred to less precisely as surface waves, but which include not only surface waves in the stricter sense (SAW-waves; Rayleigh waves) but also include Bleustein waves, SSBW waves (surface skimming bulk waves), STW waves (surface transverse waves), Love waves. Such arrangements utilize transducers for converting electrical signals into such waves or, respectively, for converting such waves into electrical signals. Transducers are known comprising interdigital transducers which are formed of interdigitally arranged finger electrodes which usually are respectively connected to a bus bar. The basic type of such interdigital transducer is composed of two bus bars which extend parallel to each other from which extend rectangular narrow metallization strips are respectively directed toward the other bus bar and which are referred to as finger electrodes and are connected to the associated bus bar which extends on the surface of the substrate. In this basic type, neighboring finger electrodes which follow after each other are electrically connected alternately to the bus bars. Any arrangements of finger electrodes of a transducer of the basic type are also effectively equiphase inside the transducer.

The functioning of such a transducer is such that the acoustical (mechanical) wave is generated by the piezoelectric effect in the piezoelectric material between the finger electrodes and is generated by applying an electical signal between the two bus bars and the signal thus appears between the neighboring finger electrodes. Such an interdigital finger electrode arrangement has a fundamental resonant frequency which corresponds to the periodicity of the fingers. Such an interdigital transducer usually emits acoustic waves in the material in both directions perpendicular to the finger electrodes. Such an interdigital transducer however has the undesirable characteristic that reflections of the generated acoustic wave occur inside the transducer particularly at the finger electrodes. For this reason, the use of split finger electrode arrangements for transducers has already been provided for more than ten years. The utilization of such split finger arrangements however has the disadvantage in that the maximum obtainable fundamental resonant frequency is only one-half as high as that obtainable with a transducer of the basic type wherein the precondition of the finger electrodes are of equal width is maintained. The maximum possible fundamental frequency for such transducers is defined by the technological limit for the manufacture of electrode fingers having the smallest possible width. This dimension at the present time is about 1 $\mu$m using a spacing about 1 $\mu$m clearance between neighboring finger electrodes.

Publication IEEE Transactions On Sonics and Ultrasonics, Vol. SU-22 (1975), pages 395–401, shows in FIG. 3 transducer arrangements of various types. In FIG. 3, the uppermost example is a transducer arrangement of the basic type. The third view shows a split finger arrangement which has been described previously. The transducer of the second line illustrates an arrangement which in terms of principal is between the other two transducer arrangements. The fourth line shows a split finger arrangement comprising additionally inserted floating fingers which are fingers which are not connected to any of the bus bars, in other words, have a floating potential. The position of the resonant frequencies of the respective transducer is indicated to the right of these transducer arrangement in this FIG. 3. The fundamental resonant frequency of the associated transducer is listed with respect to line 1. The fundamental frequencies always become smaller and the associated higher harmonics or, respectively, harmonic frequencies are indicated in the lines which are below. The split finger transducer of line 3 has a fundamental frequency which is one-half as high as the transducer of line 1 and has a resonance at the third harmonic. Analogous situations applies to the embodiments illustrated in the remaining lines. However, it should be realized that with respect to FIG. 1 that operation of the respective transducer at its harmonic is not practical. It must also be realized that the further development of a transducer of line 1 in the direction of the transducers of the following lines 2, 3 and 4 of FIG. 3 in this publication results in an increasing reduction of the frequency which can be used as the fundamental frequency.

Another way of eliminating the internal reflections in an interdigital transducer of the basic type is to provide unequal clear spacings within the finger electrode arrangement of the transducer. Assuming that the finger width of such a transducer is $\lambda/4$ wherein $\lambda$ is the wavelength of the acoustic wave at the fundamental resonance and, thus, the narrow spacing between neighboring fingers is likewise selected to be equal to $\lambda/4$ then the broader clearance between electrode fingers in such transducers is $\lambda/2$ wherein destructive interferences for reflected portions of the acoustic wave are effected. With comparable finger width such a transducer has the same fundamental frequency as the transducer of the basic type. Such a transducer however has relatively pronounced secondary lobes which can result in disturbances. A further disadvantage of this transducer is the unequal spacing between electrode fingers. Unequal clearances lead to irregularities in the manufactured structure and when using the exposure process which is necessarily used to manufacture the structure this causes additional disturbances in the electrical characteristics of such a transducer.

Transducers manufactured and operated as code generators such as known from the two publications IEEE Transactions on Circuit Theory, Vol. CT-20, No. 5, September 1973, Pages 459–470 and particularly FIG. 13 and the publication by Matthews, entitled Surface Wave Filters, 1977, Pages 307–346, by John Wiley and Sons, particularly FIG. 7.1 have a purely accidental and only apparent similarity to the present invention. These articles disclose code generators which comprise finger groups which have an incorporated code on the basis of their different group lengths or, respectively, the number of fingers of the individual groups. For example, the finger group which is the first from the left in FIG. 13 therein has a length which is five times as great as the narrowest finger group. An identical number of fingers for all groups is impossible in such a code generator or the finger groups would have no informational content.

See also U.S. Pat. No. 4,506,239, 4,099,148, 3,766,496, 3,701,147, 3,633,118, 3,551,837 and publications U.S. Electronics Letters, 17 May 1973, Vol. 9, No. 10, pages 239–240 and U. S. Microwave Journal of July 1974, Pages 42–45.

SUMMARY OF THE INVENTION

It is an object of the present invention to provide a solution for the problem of suppressing the interwave reflections of an interdigital transducer without reducing the useable fundamental frequency of the transducer and wherein no additional technological manufacturing difficulties arise. The object is achieved with a transducer wherein different neighbouring groups of the interdigital fingers have opposite phases at the fundamental frequency of the groups. An especially advantageous improvement of the invention is a filter comprising at least two transducers according to the invention wherein one transducer has a number of finger electrodes in each group which differs from the number of finger electrodes of the groups of another transducer.

The "finger electrodes" in the specification are finger electrodes that are excitation active due to their electrical connection to one of the bus bars. In the specification "dummy fingers" can also be provided in a transducer and such fingers have certain functions, but they have practically no part in the electromechanical energy conversion.

The present invention is based on the realization that a transducer according to the invention which differs from a transducer of the basic type and is operated so as to deviate from the prior art should definitely have clearances between the finger electrodes of identical size just as in a transducer of the basic type. With the transducer of the invention, not only can this advantageous condition be maintained, but also the advantage additionally results for at least many designs that a resonant frequency for the fundamental wave excitation useable for operation of the transducer is available which is even higher than prior art transducers of the basic type using a minimum width of the finger electrodes and width of the clearances having the same size as compared to the transducers of the prior art. The two neighboring frequencies occuring in a transducer of the invention are not harmonics or upper harmonics, but rather they are two fundamental frequencies which differ somewhat from each other which occur as a pair of frequencies. Both fundamental frequencies are practically equivalent and are located symmetrically relative to the fundamental frequency of a transducer of the basic type comprising the same finger dimensions and finger spacings. In the invention, thus, a respective fundamental frequency having a higher frequency value as compared to transducers of the basic type is available. In the invention, there is achieved that the "limiting frequency" for the use of such filters is increased assuming technological outlay of the same magnitude and disturbances based on manufacturing are kept to a minimum with a finger width of the same size as compared to the prior art devices. The invention thus not only achieves a reduction of the interreflections, but improves the frequency range for employing such transducers which is expanded.

The improvement of the invention comprises forming a filter having two transducers which have a different number of finger electrodes for groups of the respective transducers. For example, one transducer of the filter has finger groups which each comprise four finger electrodes and the other transducer has ten finger electrodes for each group. This results in that the respective symmetrically arranged fundamental frequencies of the one transducer have a spacing which is different from each other compared to the other transducer which has a different number of finger electrodes in its groups. The one transducer is dimensioned such that its fingers have a periodicity wherein its upper fundamental frequency is the same as the upper fundamental frequency of the other transducer, but the lower fundamental frequencies of the transducers differ from each other. Different alternative arrangements for choosing this result allow the respective lower fundamental frequencies to be the same or to dimension the upper fundamental frequency of a transducer to be the same as the lower fundamental frequency of the other transducer. These alternatives have respective advantages for suppressing other fundamental frequencies.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

The FIG. is a plan view illustrating a filter having two transducers.

DESCRIPTION OF THE PREFERRED EMBODIMENTS

The FIG. illustrates a filter having two transducers each which have a number of finger electrodes and wherein the finger arrangements differ.

A substrate 12 has formed thereon a first transducer 1 and a second transducer 2 which is offset laterally from the first transducer. The transducer 1 is formed by a pair of parallel extending bus bar conductors 11 and 11' which are spaced from each other and a first group of interdigital fingers 10 are attached to the bus bar 11' and a second group of fingers 9 are attached to the bus bar 11 as illustrated. The fingers of the transducer 1 are divided into groups and, for example, a first group 3 includes two fingers 10 and two fingers 9, a second group 4 includes two fingers 10 and two fingers 9. A group 3' has only three fingers with two fingers 10 and one finger 9. It is to be noted that where groups 4 and 3 join, that the last finger relative to the propagation direction of group 4 has a finger 9 and the adjacent finger is a finger 9 which is the first finger of group 3 as illustrated. This arrangement results in a phase shift between groups 4 and 3. The transducer 2 is formed with parallel extending bus bars 110 and 111 and fingers 100 are attached to bus bar 111 and fingers 112 are connected to bus bar 110. The fingers 100 and 112 are divided into groups 6 and 7 in the transducer 2 and the fingers 100 and 112 alternate in each group. However, where the groups join, the last finger in the top group 6, for example, is a finger 100 and the first finger in the next group 7 is the finger 100. This results in a phase shift of the wave as it travels in the wave propagation direction x.

It is to be noted that the group 3' comprises fewer finger electrodes 9 and 10 than are provided for the remaining groups 3 and 4 of the transducer 1. A finger electrode 10' which would have been the last finger electrode is shown only with broken lines and is omitted in the finger group 3'. Instead of, for example, omitting such finger electrode 10' a floating finger can also be provided which is not attached to either of the bus bars 11 or 11'.

According to a further modification, dummy fingers can also be added at one end or, respectively, at both ends of the transducers. Dummy fingers are fingers that are either connected to the bus bar at which the first or last excitation active electrode finger is connected or either which are not connected to any bus bar. They usually serve the purpose for electrically screening neighboring transducers from each other and they are thus located at mutually facing ends of two transducers. Since dummy fingers are not excitation active, they need not be taken into consideration relative to the number of electrode fingers provided in the invention because they are not in fact electrode fingers which are active.

It can be seen from the FIG. that the finger electrodes following one another at the ends of adjacent groups 3 or 4 in transducer 1 or 6 and 7 in transducer 2 are not connected in alternative arrangements but are connected to one and the same bus bar 11 or 11' or 110 or 111. In such a case, a transducer 1 or 2 is a transducer of the basic type or is to be operated at the frequency of the basic type, but the two neighboring groups 3 and 4 or, respectively, 6 and 7 would be out of phase relative to each other. The excitation generated by one group 3 at the frequency of the basic type would be opposite in phase to the electrical excitation which would be generated by the neighboring group 4. With operation of the transducer 1 or the transducer 2 in the frequency position provided for the respective transducer, of course, all groups 3, 3', 4 or 6 and 7 operate in equiphase fashion, but without the interdigital reflections since these are eliminated with the invention on the basis of the position of the finger electrodes. Thus, these interdigital reflections of the prior art transducers are eliminated in the invention. The direction of wave propagation of the transducers 1 and 2 on the substrate is indicated by x. For example, the transducer 1 can be operated as a transducer for generating an acoustic wave in the surfaces of the substrate 12 with corresponding electrical excitation of the finger electrodes 9 and 10 and the transducer 2 serves as a reception transducer in which the signal contained in the generated acoustical surface wave is converted back into an electrical signal.

In the transducers of the invention, the periodicity of the finger electrodes 9 and 10 and 110 and 111 of the respective transducers 1 or 2 define the fundamental frequencies occurring in pairs and only a singly fundamental frequency occurs in a transducer of the prior art type. Practical embodiments of a filter comprising transducers of the invention result when mutually different numbers of fingers per group are specified for both transducers. In other words, one transducer 1 may comprise finger groups each having four finger electrodes and the transducer 2 may comprise finger groups each having ten finger electrodes. The height of the paired fundamental frequencies is a function of the number of finger electrodes per group. The larger number of finger electrodes, for example, ten fingers per group in transducer 2 results in a somewhat higher, lower fundamental frequency and in a lower upper fundamental frequency as compared to a transducer having a lower number of finger electrodes per group, for example, only four finger electrodes as in the transducer 1.

By using appropriate matching or balancing of the periodicity of the finger electrode arrangement by selecting the spacings and finger widths, the upper fundamental frequency of one transducer and the lower fundamental frequency of the other transducer may be at one and the same frequency or the respective upper fundamental frequency or, alternatively, respective lower fundamental frequency is selected as a coinciding operating frequency for both transducers.

It is seen that the present invention provides transducers for operating with acoustic surface-proximate waves each having interdigital finger arrangements divided into groups and wherein the phase is shifted between certain groups by providing that adjacent fingers between the groups are connected to the same bus bar. The invention also provides that the transducers have different number of finger in each group.

Although the invention has been described with respect to preferred embodiments, it is not to be so limited as changes and modifications can be made which are within the full intended scope of the invention as defined by the appended claims.

I claim as my invention:

1. A transducer arrangement which operates with acoustic, surface-proximate waves, comprising a substrate of piezoelectric material, a plurality of interdigitally arranged finger electrodes and bus bars having electrical terminals on said substrate, said plurality of finger electrodes have essentially the same width and have identical spacings from each other and are alternately connected to said bus bars wherein the finger electrodes (10) of the transducer (1; 2) are arranged as groups (3, 4; 6, 7) with a prescribed number of similar dimensioned fingers of at least four successive finger electrodes which are alternately connected to said bus bars and wherein five adjacent ones of said groups (3-4, 4-3; 6-7, 7-6 ...) of fingers in the transducer (1, 2) are arranged relative to one another such that the neighboring one of said groups are 180 degrees out of phase relative to one another at the fundamental center frequency of said groups.

2. A transducer according to claim 1, characterized in that at least one of the two of said groups mounted at both ends of the transducer has a lower number of finger electrodes connected to a respective bus bar as compared to the prescribed number of finger electrodes of other of said groups.

3. A transducer according to claim 1 or 2, wherein the number of finger electrodes of a group is not greater than about 20.

4. A transducer according to claim 1 or 2, wherein the minimum number of finger electrodes of any of said group is equal to 10.

5. A filter which operates with acoustic surface-proximate waves comprising: a substrate of piezoelectric material, at least two transducers mounted on said substrate adjacent each other, two of said transducers having a plurality of interdigitally arranged finger electrodes and bus bars having electrical terminals on said substrate, said plurality of finger electrodes having essentially the same width and having identical spacings from each other and are alternately connected to said bus bars wherein the finger electrodes (10) of the transducer (1; 2) are arranged as a plurality of groups (3, 4; 6, 7), each of said plurality of groups of the one and of the other of said two transducers respectively having a prescribed number of similar dimenioned fingers of at least four successive finger electrodes which are alternately interdigitally connected to said bus bars and wherein adjacent ones of said groups (3-4, 4-3; 6-7, 7-6 . . . ) of fingers in the transducer (1, 2) are arranged relative to one another such that the neighboring ones of said groups are 180 degree out of phase relative to one another at the fundamental center frequency of said groups, and wherein said transducers are dimensioned such that the upper fundamental frequency of the one of said transducers is identical to the lower fundamental frequency of the other of said transducers.

6. A filter according to claim 5, wherein the number of said fingers in said groups of the one of said transducers is different from the number of the fingers in said groups of the other of said two transducers.

7. A filter according to claim 6 characterized in that at least one of said two groups which are mounted at an end of the transducer has a lower number of finger electrodes connected to a respective bus bar than the number of finger electrodes of said other groups.

8. A filter according to claim 5 characterized in that at least one of said two groups which are mounted at an end of said transducer has a lower number of finger electrodes connected to a respective bus bar than the number of finger electrodes of said other groups.

9. A filter which operates with acoustic surface proximate waves comprising: a substrate of piezoelectric material, at least two transducers mounted on said substrate adjacent each other, two of said transducers having a plurality of interdigitally arranged finger electrodes and bus bars having electrical terminals on said substrate, said plurality of finger electrodes having essentially the same width and have identical spacings from each other and are alternately connected to said bus bars and wherein the finger electrodes (10) of said transducer (1, 2) are arranged as a plurality of groups (3, 4,; 6, 7), each of said groups of the one and of the other of said two transducers respectively having a prescribed number of similar dimensioned fingers of at least four successive finger electrodes which are alternately connected to said bus bars and wherein adjacent ones of said groups (3-4, 4-3; 6-7, 7-6 . . . ) of fingers in the transducer (1, 2) are arranged relative to one another such that the neighboring ones of said groups are 180 degree out of phase relative to one another at the fundamental central frequency of said groups, and wherein the lower or the upper fundamental frequencies of said transducers coincide.

10. A filter according to claim 9 wherein the number of said fingers in said groups of the one of said transducers is different from the number of fingers in said groups of the other of said two transducers.

11. A filter according to claim 10 characterized in that at least one of said two groups which are mounted at an end of said transducer has a lower number of finger electrodes connected to a respective bus bar than the number of finger electrodes of said other groups.

* * * * *